United States Patent
Johnson (10) Patent No.: US 6,424,404 B1
(45) Date of Patent: Jul. 23, 2002

(54) MULTI-STAGE MICROLENS ARRAY

(76) Inventor: Kenneth C. Johnson, 2502 Robertson Rd., Santa Clara, CA (US) 95051

(*) Notice: Subject to any disclaimer, the term of this patent is extended or adjusted under 35 U.S.C. 154(b) by 25 days.

(21) Appl. No.: 09/654,219

(22) Filed: Sep. 1, 2000

Related U.S. Application Data (63) Continuation-in-part of application No. 09/481,379, filed on Jan. 11, 2000.
(60) Provisional application No. 60/115,450, filed on Jan. 11, 1999, provisional application No. 60/115,451, filed on Jan. 11, 1999, provisional application No. 60/116,074, filed on Jan. 15, 1999, and provisional application No. 60/119,403, filed on Feb. 1, 1999.

(51) Int. Cl.[7] ............................ G03B 13/24; G03B 27/52
(52) U.S. Cl. ............................ 355/44; 355/40; 355/43
(58) Field of Search .......................... 355/40, 43, 38, 355/44, 46, 52, 53, 55, 67, 77; 359/619–626

(56) References Cited

U.S. PATENT DOCUMENTS

| | | | |
|---|---|---|---|
| 5,517,279 A | 5/1996 | Hugle et al. | 355/46 |
| 5,631,721 A | * 5/1997 | Stanton et al. | 355/71 |
| 5,982,552 A | * 11/1999 | Nakama et al. | 359/620 |
| 6,016,185 A | 1/2000 | Cullman et al. | 355/52 |
| 6,133,986 A | * 10/2000 | Johnson | 355/67 |

FOREIGN PATENT DOCUMENTS

| | | |
|---|---|---|
| WO | WO 97/34171 | 9/1997 |
| WO | WO 98/12603 | 3/1998 |

OTHER PUBLICATIONS

Davidson, Mark, "A Microlens Direct–Write Concept for Lithography," SPIE vol. 3048, pp. 346–355 (1977).

Völkel, R. et al., "Microlens lithography," Conference: 1996 Display Manufacturing Technology Conference, Digest of Technical Papers, First Edition, pp. 95–96 (Publisher: Soc. Inf. Display, Santa Ana, Ca).

Völkel, R. et al., "Microlens array imaging system for photolithography," Opt. Eng. 35(11) (Nov. 1996); pp. 3323–3330.

Völkel, R. et al., "Microlens lithography: A new approach for large display fabrication," Microelectronic Engineering 30 (1996); pp. 107–110.

Völkel, R. et al., "Microlens lithography and smart masks," Microelectronic Engineering 35 (1997); pp. 513–516.

* cited by examiner

Primary Examiner—Russell Adams
Assistant Examiner—Hung Henry Nguyen
(74) Attorney, Agent, or Firm—Townsend and Townsend and Crew LLP

(57) ABSTRACT

A multi-stage microlens array with an array of compound lenses, each compound lens having a sequence of progressively smaller, higher-power lens elements. The array can have a high fill factor over the first-stage lens array, but still provide sufficient space between the terminal lens elements to accommodate structural support and components such as lens focus actuators. The microlens array can be incorporated into a printing system that includes an optical projection system, a scanning mechanism, an array of light-modulating image source elements providing an image source, and an image modulation mechanism that controls the image source as the printing surface is scanned. The microlens array can also be incorporated into an imaging system that includes an optical projection system, a scanning mechanism, an array of light-sensing detector elements, and a data acquisition system that records the detector response as the scanning mechanism operates.

5 Claims, 7 Drawing Sheets

MULTI-STAGE MICROLENS ARRAY

CROSS-REFERENCE TO RELATED APPLICATIONS

This application is a continuation-in-part of U.S. patent application No. 09/481,379, filed Jan. 11, 2000, for "Multi-Stage Microlens Array," which claims priority from the following provisional applications, the disclosures of which are incorporated by reference:

No. 60/115,450, filed Jan. 11, 1999, for "Dual Flexure Light Valve (DFLV);"

No. 60/115,451, filed Jan. 11, 1999, for "Conformal Imaging Microlens Array;"

No. 60/119,403, filed Feb. 1, 1999, for "Conformal Imaging Microlens Array With High Fill Factor;" and No. 60/116,074, filed Jan. 15, 1999, "Spatially Modulated Microlens Array for EUV Maskless Lithography."

The following patent applications are hereby incorporated by reference in their entirety for all purposes:

No. 08/803,096, filed Feb. 20, 1997, for "Microlens Scanner for Microlithography and Wide-Field Confocal Microscopy;" and No. 60/114,782, filed Jan. 5, 1999, for "Bigrating Light Valve."

BACKGROUND OF THE INVENTION

This invention relates to the use of microlens arrays for printing (including microlithography) and microscopy applications. The above-noted co-pending patent application (Ser. No. 08/803,096, hereafter '096) discloses an imaging system comprising a microlens array that is used to either project an image onto a printing surface, or to acquire an image of an imaging sample surface, by scanning the surface across the microlens array's focal plane. There are advantages to using very small (e.g., micron-scale) microlenses for such applications. For example, the microlenses' focusing resolution may be limited by chromatic dispersion and by the size of the illumination source (if an extended source such as an arc lamp is used), but the effect of these factors can be mitigated by using small microlenses. (If the microlenses are sufficiently small these factors become insignificant and focusing resolution is dominated by diffraction.) If the microlens material has significant optical absorption over the operating wavelength range, it would also be advantageous to use small microlenses in order to minimize the absorption loss. However, very small microlenses cannot easily be formed without incurring significant fill factor losses. The microfabrication processes may not be able to produce accurately profiled lens surfaces if the microlens apertures are closely juxtaposed. The structure supporting the microlenses can also take up a lot of space between microlenses (particularly if the structural material is not optically transparent and has open light transmission channels). Furthermore, if the microlens array is integrated with electronic or micromechanical components (e.g., surface proximity sensors or microlens focus actuators), the space required to accommodate these elements can also significantly limit the lens fill factor.

SUMMARY OF THE INVENTION

The invention comprises a plurality of compound lenses, wherein each compound lens preferably comprises two microlens elements, which are designated as a "first-stage" microlens $L_1$ and a "second-stage" microlens $L_2$. $L_1$ is a comparatively large, low-power element which focuses incident illumination onto $L_2$, and $L_2$ is a much smaller, higher-power element which focuses the illumination onto a highly-resolved focal point on or close to an imaging sample or a printing surface. (In a microscopy application, the compound lens also functions to collect reflected or back-scattered radiation from the focal point.) The $L_1$ elements are closely juxtaposed to achieve a high fill factor, whereas the $L_2$ elements, being much smaller, cover a much smaller area fraction on the $L_2$ aperture plane. Thus, this design configuration provides sufficient clearance space between the second-stage elements to accommodate sensors, actuators, data paths, or structural elements without incurring significant fill-factor-related efficiency losses.

More generally, each compound lens could comprise N microlens elements $L_1, L_2, \ldots L_N$ (N being an integer greater than 1), wherein each element $L_m$ ($1 \leq m < N$) focuses the illuminating radiation onto the next element $L_{m+1}$ in the sequence and the last element $L_N$ focuses the radiation onto a focal point on or close to the imaging sample or printing surface. (This focal point is referred to as the compound lens's "terminal focal point" and element $L_N$ is referred to as the "terminal lens element".) Typically, $L_1$ is a comparatively large element with low optical power, and the succeeding elements are progressively smaller and have progressively higher optical power. (The "focusing" action of the microlenses is more analogous to that of a condenser lens than of an imaging lens, in that each microlens functions to condense incident illuminating radiation onto a target illumination spot. Unlike conventional imaging systems, the microlenses do not necessarily have well-defined focal planes, or if they do they need not operate at exactly their design focal lengths.)

The invention could be especially useful when used in conjunction with focus-actuated microlenses. In this embodiment, each terminal microlens element is formed on a flexible layer that is supported over a substrate, and the microlens's focus position is controlled by means of electrostatic interaction between conductors on the layer and on the substrate. A single-stage array of microlenses of this type would incur significant fill factor losses associated with the focus actuator mechanism and control circuitry, but the multi-stage configuration circumvents this limitation. Focus-actuated microlenses could be used in lithography applications to perform conformal lithographic printing on complex surface topographies, thus reducing the need for planarization in semiconductor wafer processing. For microscopy applications, focus-actuated microlenses could make it possible to perform high-resolution, conformal imaging on three-dimensional surface topographies.

Any of the single-stage microlens printing and microscopy systems disclosed in the '096 application (or other cross-referenced applications) could be adapted for use with the present invention by replacing the single-stage microlens array with a multi-stage microlens array, such as (for example) the focus-actuated array described above.

A further understanding of the nature and advantages of the present invention may be realized by reference to the remaining portions of the specificationa and the drawings.

DESCRIPTION OF THE SPECIFIC EMBODIMENTS

Figure 1:
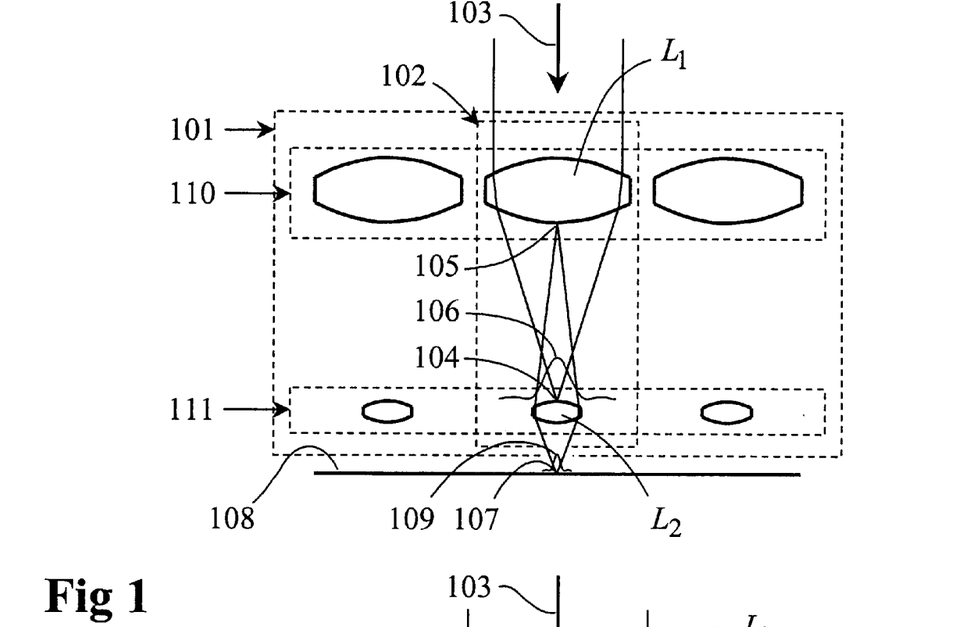
FIG. 1 is a cross-sectional view of a two-stage microlens array.

FIG. 1 illustrates a two-stage microlens array 101 comprising compound lenses such as compound lens 102, each of which comprises a first-stage lens element $L_1$ and second-stage lens element $L_2$. Incident illumination 103 is focused by $L_1$ toward a point 104 at the center of $L_2$, but due to effects such as aperture diffraction, chromatic dispersion, or the illumination's angular divergence, the focused illumination spot on $L_2$ (indicated by illumination intensity profile 106) actually covers an area comparable to or larger than the $L_2$ clear aperture area. Element $L_2$ is configured to focus radiation from element $L_1$'s center point 105 toward a "terminal focal point" 107 on or close to an imaging sample or printing surface 108. (In a microscopy application the compound lens 102 would also function to collect radiation reflected from point 107 and direct it back along the illumination path.) The focused illumination profile on surface 108 is indicated as 109. Typically, $L_2$ would have a numerical aperture much higher than that of $L_1$ and its focal length would be much shorter, so its focus spot 109 would be much smaller than that of $L_1$ (106).

The $L_1$ lens elements collectively form a first-stage microlens array 110, and the elements are preferably closely spaced to optimize the array's fill factor (which is defined as the fraction of the array area covered by the $L_1$ clear apertures). The $L_2$ lens elements collectively form a second-stage microlens array 111. Due to the small $L_2$ aperture size, there is space between $L_2$ apertures to accommodate structural support elements and components such as $L_2$ focus actuators.

Figure 2:
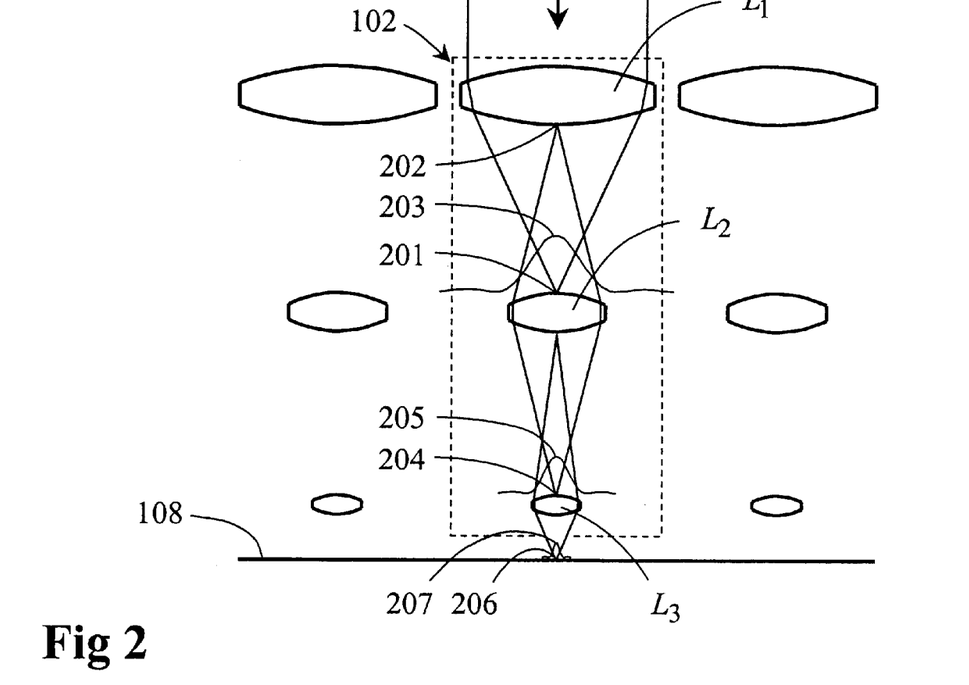
FIG. 2 is a cross-sectional view of a three-stage microlens array.

FIG. 2 illustrates a three-stage embodiment in which each compound lens 102 comprises three lens elements $L_1$, $L_2$, and $L_3$. $L_1$ focuses incident illumination 103 toward a point 201 at the center of $L_2$ (producing illumination intensity profile 203 on $L_2$); $L_2$ is configured to focus radiation from the center point 202 of $L_1$ toward point 204 at the center of $L_3$ (producing illumination intensity profile 205); and $L_3$ is configured to focus radiation from point 201 onto a "terminal focal point" 206 on or close to surface 108, producing illumination intensity profile 207.

For a general N-stage microlens array, each compound lens comprises lens elements $L_1$, $L_2$, ... $L_N$. Element $L_1$ focuses incident illumination toward the center of $L_2$. For $1<m<N$, element $L_m$ is configured to focus radiation from the center of $L_{m-1}$ toward the center of $L_{m+1}$. $L_N$ is configured to focus radiation from the center of $L_{N-1}$ toward a focal point on or close to the imaging sample or printing surface. (This last focal point is the compound lens's "terminal focal point" and element $L_N$ is the "terminal lens element".) For microscopy applications, the radiation reflected or back-scattered from the imaging sample retraces the same path in reverse order and is collected by a detection system (although if $L_N$ is not accurately focused on the sample the collected radiation path could deviate from the illumination path). The conjugate focusing relationships indicated above need not hold precisely since the microlenses function essentially as point-imaging illumination condensers, and not as full-field imaging systems.

Any of the single-stage microlens printing and microscopy system disclosed in the '096 application (or other cross-referenced applications) could be adapted for use with a multi-stage microlens array by replacing the single-stage microlens array with a multi-stage array. For microscopy applications, the array's first-stage microlens array is positioned at the projection system's object plane and the terminal focal points are positioned proximate to the imaging sample. For printing applications, the first-stage microlens array is positioned at the projection system's image plane and the terminal focal points are positioned proximate to the printing surface.

Figure 3:
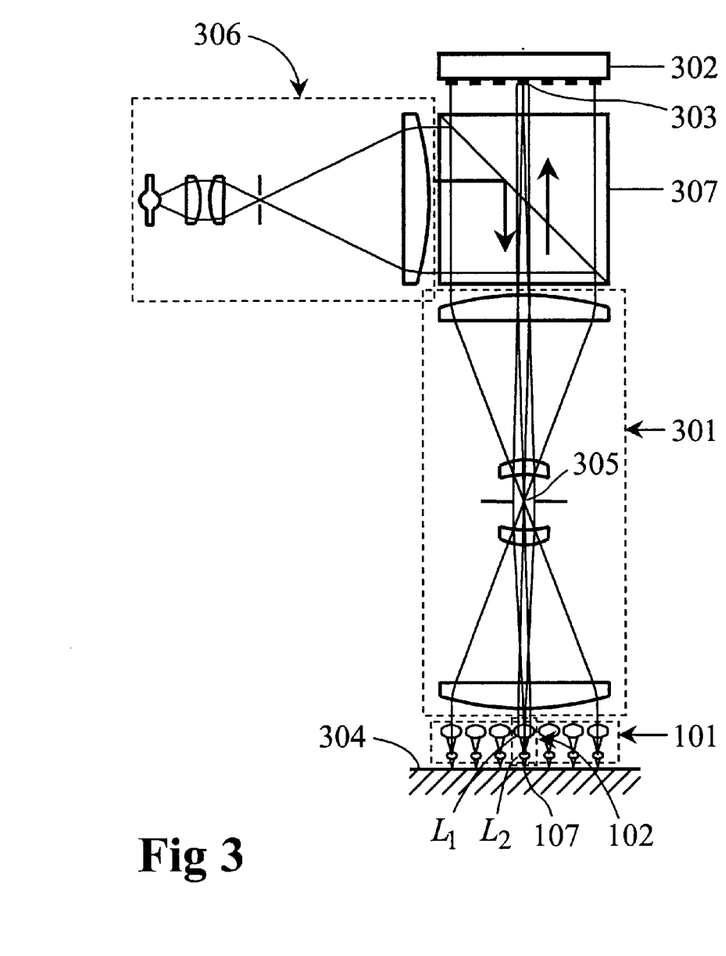
FIG. 3 illustrates the use of a multi-stage microlens array in a microscopy stem.

FIG. 3 illustrates the use of a multi-stage microlens array (in this example, a two-stage array) in a microscopy system. (This is similar to FIG. 1 in the '096 application, except that a two-stage microlens array is used.) The system contains an optical projection system 301, which is typically low-resolution and doubly-telecentric, that images the microlens array 101 (cf. FIG. 1) onto an optical detector array 302, with each first-stage microlens element being imaged onto a corresponding detector pixel element. For example, the first-stage lens element $L_1$ of compound lens 102 is imaged onto pixel 303. Each individual compound lens in array 101 collects radiation from a corresponding spot on or close to the imaging sample 304 (which corresponds to surface 108 in FIG. 1) and focuses it onto the projection system's aperture stop 305. Thus the corresponding detector pixel senses the sample reflectivity over a very small spot on surface 304. For example, compound lens 102 focuses radiation from spot 107 onto the stop 305, so pixel 303 senses the reflectivity at the focal point 107 of the compound lens's second-stage element $L_2$. (For a general N-stage system, point 107 would be at the terminal focal point. In contrast to the '096 configuration, surface point 107 is not necessarily conjugate to aperture 305, although the reflected radiation from point 107 is focused by the compound lens 102 onto the aperture.) The sample is illuminated in reflection mode from an illumination system 306, using a beam splitter 307 to merge the illumination into the light path, and the imaging sample 304 is scanned to build up a high-resolution image from the detector signals.

Figure 4:
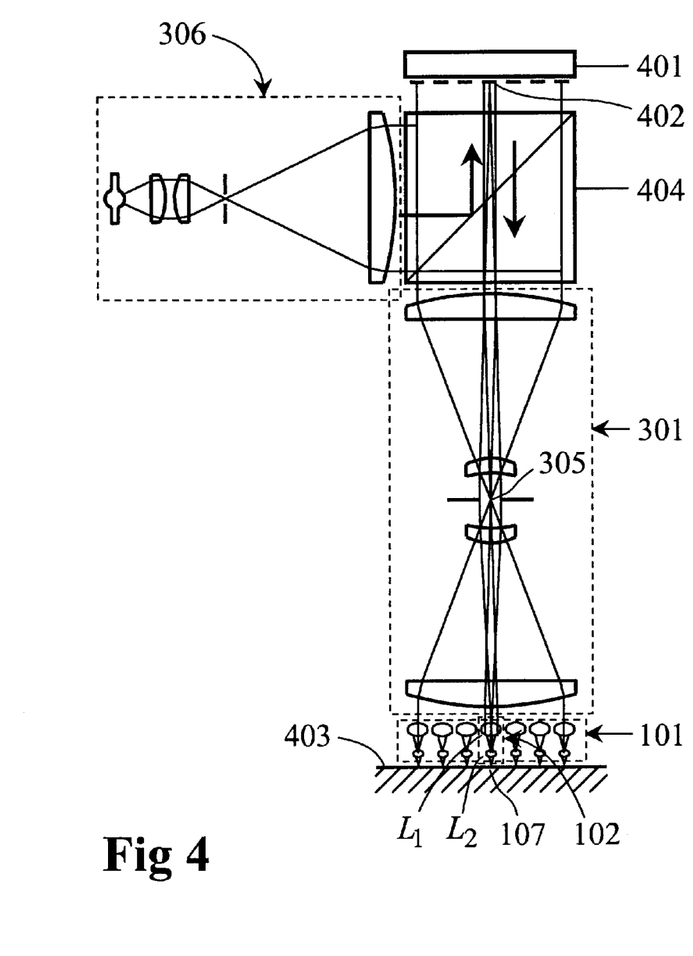
FIG. 4 illustrates the use of a multi-stage microlens array in a printing system.

FIG. 4 similarly illustrates the use of a two-stage microlens array in a printing system. (This is similar to FIG. 2 in the '096 application.) This system also contains projection system 301, (typically low-resolution, double-telecentric) but in this embodiment the projection system functions to focus an image source 401 (such as a spatial light modulator) onto the microlens array 101. The image source comprises an array of pixel elements (e.g., spots or pads of variable reflectivity, tilt-actuated mirrors, or phase-modulated reflection gratings), with each pixel being imaged onto a corresponding microlens element. For example, source pixel 402 is imaged onto the first-stage lens element $L_1$ of compound lens 102, and is modulated to control the illumination level on the corresponding $L_1$ element. The image source could be a Digital Micromirror Device, or a Grating Light Valve (U.S. Pat. No. 5,841,579), or any of a variety of alternative light-modulator mechanisms. (Some alternative mechanisms are disclosed in the above-noted provisional applications Nos. 60/114,782 and 60/115,450.) Each individual compound lens in array 101 focuses radiation from the aperture stop 305 onto a corresponding diffraction-limited spot on the printing surface 403 (which corresponds to surface 108 in FIG. 1). Thus each source pixel controls the exposure level over a very small area on the printing surface. For example, compound lens 102 focuses radiation from stop 305 onto the focal point 107 of the compound lens's second-stage element $L_2$. (For a general N-stage system, point 107 is at the terminal focal point. In contrast to the '096 configuration, surface point 107 is not necessarily conjugate to aperture 305, although radiation filtered through aperture 304 and intercepted by $L_1$ is highly concentrated at point 107.) In this embodiment the image source 401 is illuminated in reflection mode from an illumination system 306, using a beam splitter 404 to merge the illumination into the light path, and the printing surface 403 is scanned as the image source is modulated to form a high-resolution, digitally synthesized printed image.

Figure 5A:
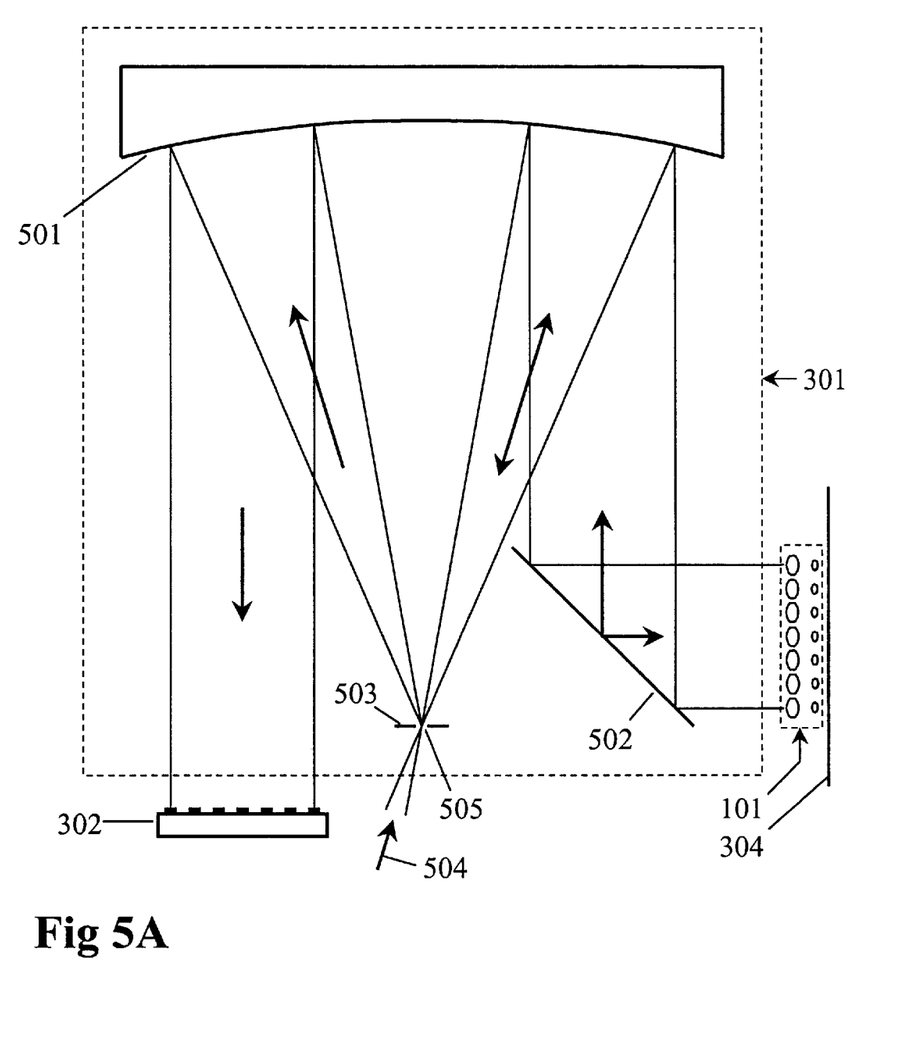
FIGS. 5A and 5B illustrate an alternative microscopy system design.

FIGS. 3 and 4 represent just one of a variety of optical configurations in which multi-stage microlens arrays can be used. The projection systems in these configurations can be replaced by alternative optical systems, such as catadioptric optics, which perform a similar function. FIG. 5A illustrates one such variant of the microscopy system (FIG. 3) in which the projection system 301 comprises a collimating mirror 501, a fold mirror 502, and a projection aperture mirror 503. Illumination 504 is brought into the system through a small spatial filter aperture 505 in mirror 503, is collimated by collimator 501, redirected by fold mirror 502, and focused by the two-stage microlens array 101 onto a focal point array on or close to the imaging sample 304.

The light reflected or back-scattered from the imaging sample retraces the same path back to mirror 503, whereupon it is reflected by mirror 503 back toward collimator 501, is recollimated, and is projected onto detector array 302. Each detector element senses radiation returned from a corresponding focal point on surface 304. (The clear aperture of mirror 503 serves the same function as the projection aperture 305 in FIG. 3. Each compound lens in the microlens array 101 projects reflected radiation from surface 304 onto a focus spot on mirror 503 that is comparable in size to or larger than the mirror 503 aperture; thus the system functions as a confocal microscope.)

Figure 5B:
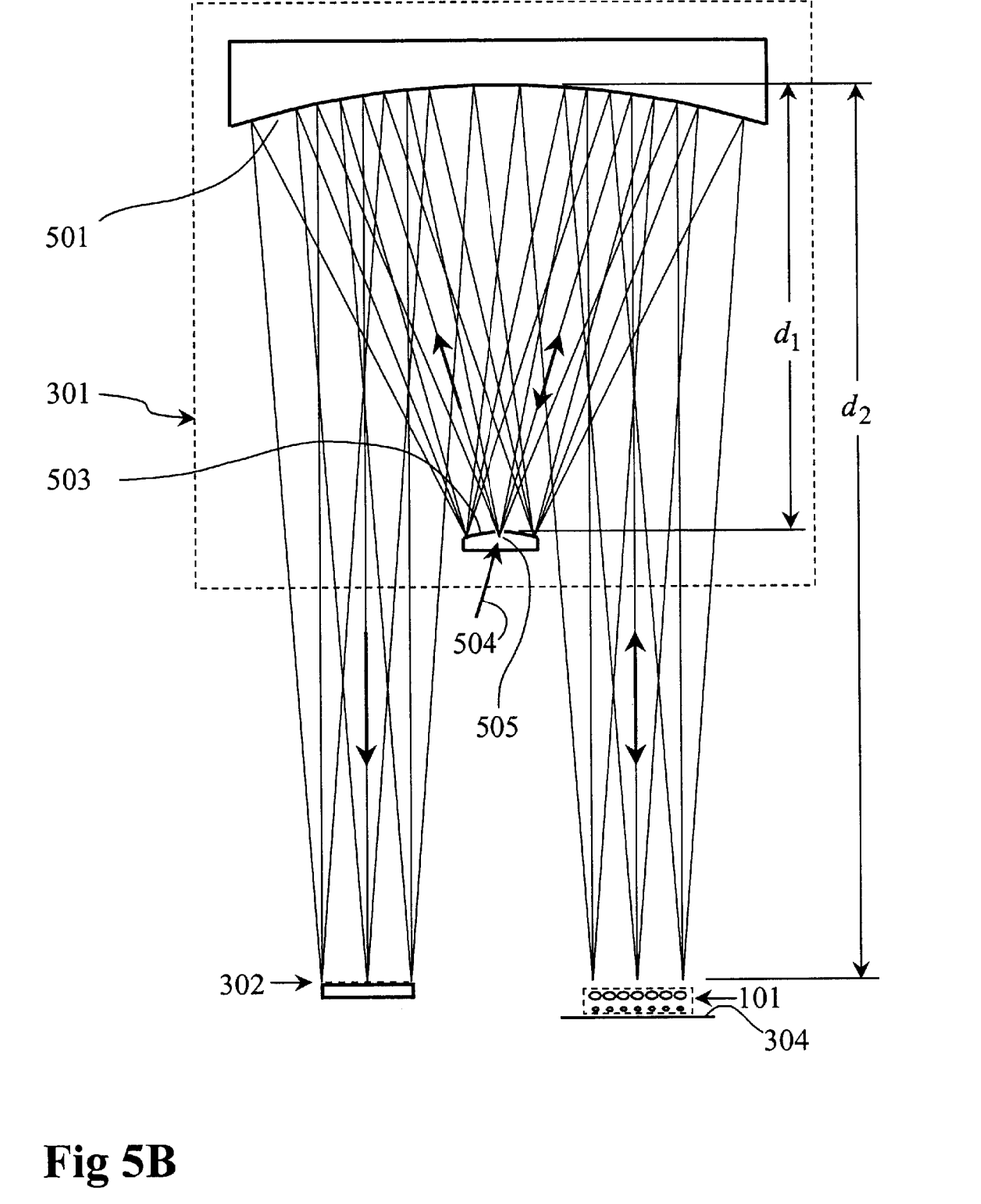

FIG. 5B illustrates a variant of the FIG. 5A configuration which is based on the "Offner Catoptric System" design described in "Lens Design Fundamentals", by Rudolph Kingslake, Academic Press, 1978; p. 321. (The fold mirror 502 is omitted in this illustration.) In this design, mirrors 501 and 503 are both spherical (or approximately spherical) elements. The axial distance between the mirrors is denoted as $d_1$, and the axial distances from the detector array 302 and from the microlens array 101 to mirror 501 are approximately identical and are denoted as $d_2$. The surface curvature radius of mirror 503 is approximately $d_1$; the surface curvature radius of mirror 501 is approximately $d_2$; and $d_2$ is approximately equal to $2d_1$.

Figure 6A:
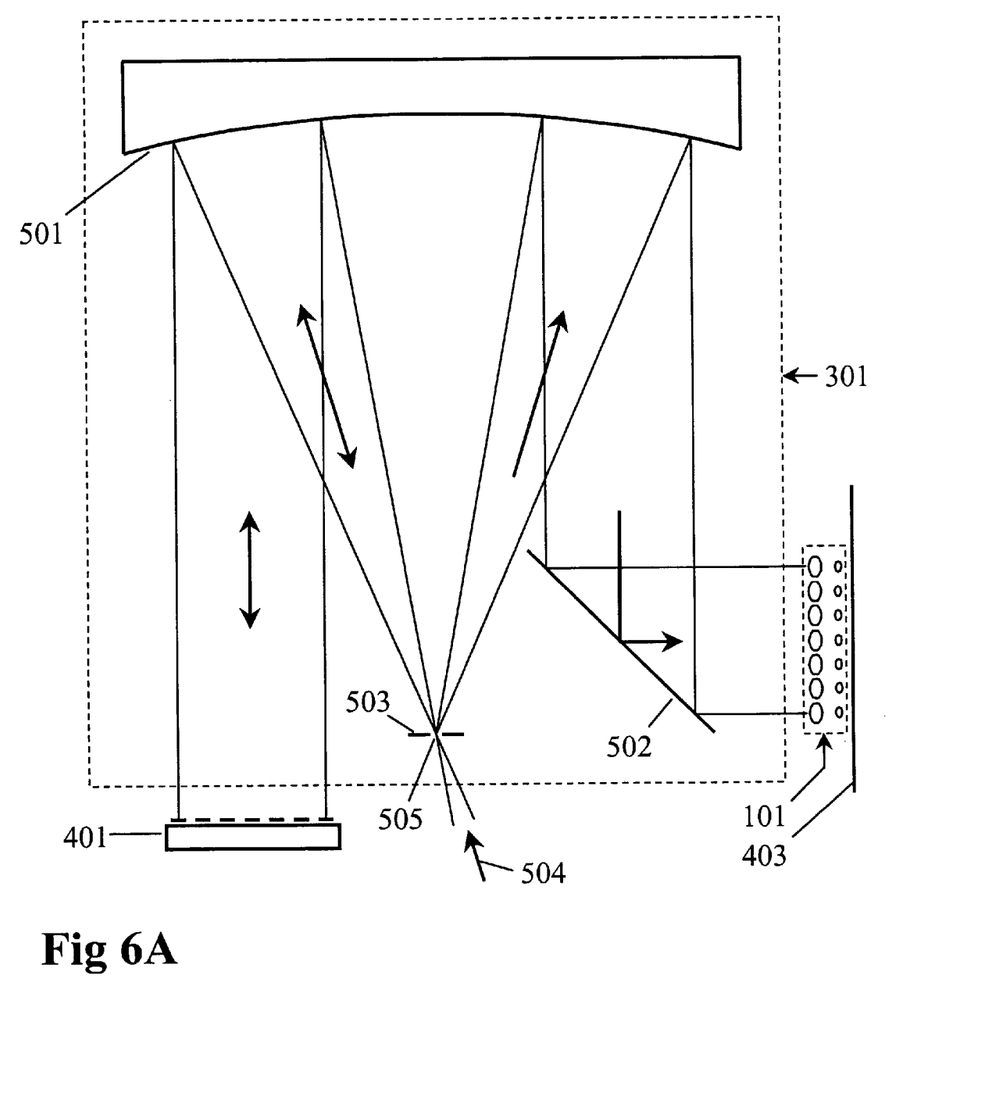
FIGS. 6A and 6B illustrate an alternative printing system design.

FIG. 6A illustrates a similar variant of the printing system (FIG. 4). The components and operational principles are similar to the microscopy system (FIG. 5A). Illumination 504 is filtered by spatial filter 505, is collimated by collimator 501 and projected onto image source 401. The light reflected from the image source retraces the same path back to mirror 503, is reflected by mirror 503 back toward collimator 501, is recollimated, and is redirected by fold mirror 502 onto the two-stage microlens array 101. The microlens array focuses the radiation onto a focal point array on or close to printing surface 403, wherein each focal point is intensity-modulated by a corresponding source pixel element on image source 401.

Figure 6B:
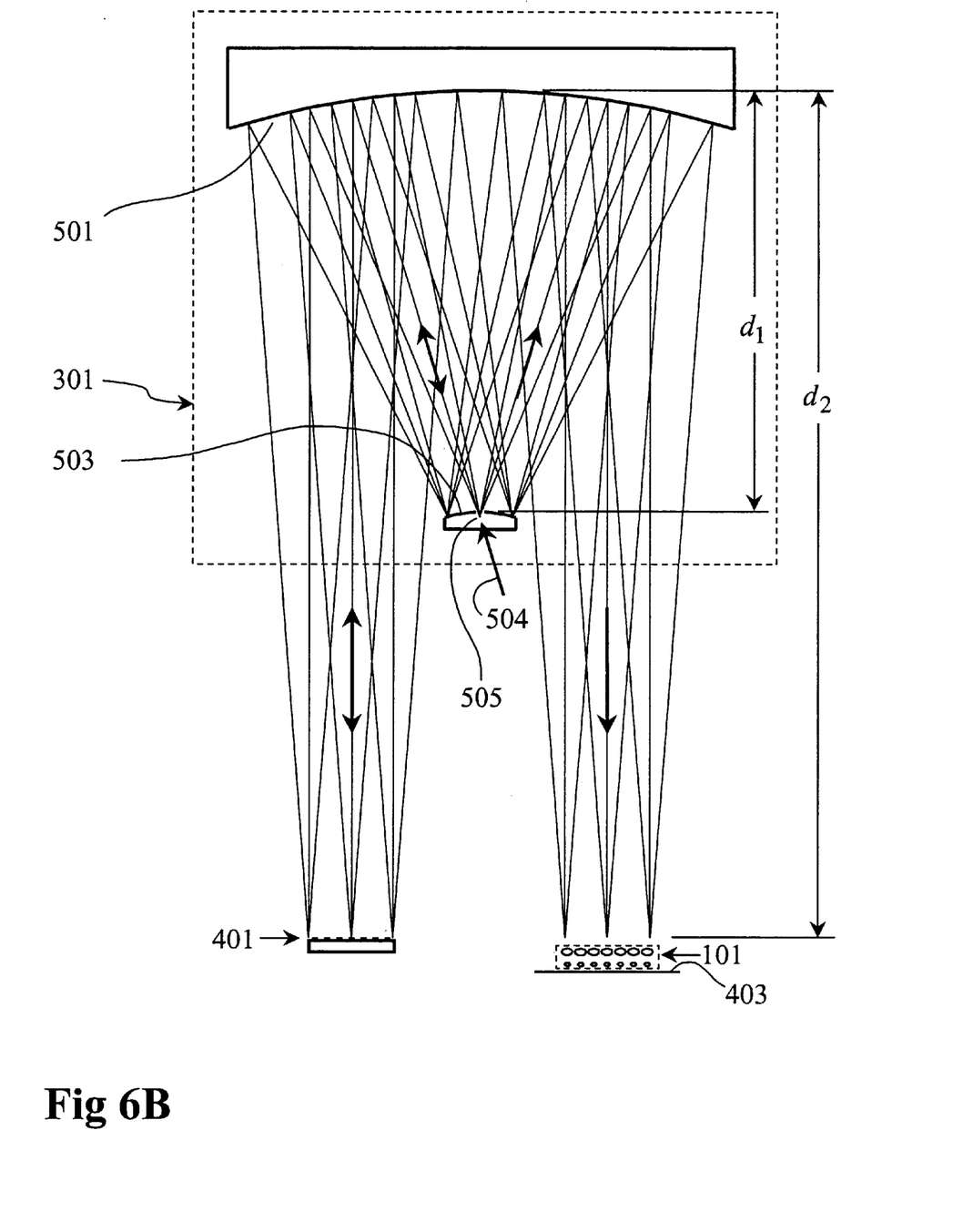

The printer system illustrated in FIG. 6A can also be configured as an Offner catoptric system, as illustrated in FIG. 6B. This design has the same optical configuration as the microscopy system described above and illustrated in FIG. 5B, except that the image source 401 and printing surface 403 in FIG. 6B replace the detector array 302 and imaging sample 304 of FIG. 5B, and the illumination 504 is directed onto image source 401.

Multi-stage microlens arrays can serve a variety of useful purposes. The resolution-limiting effects of chromatic dispersion and source size can be mitigated by using a multi-stage configuration; bulk optical absorption losses in the microlenses can be reduced; and lens fabrication tolerances can be more easily controlled by dividing the system's optical power between multiple lens stages. In addition, this design approach makes it possible to integrate mechanisms such as surface proximity sensors and lens actuators in the microlens array without incurring fill factor losses. For example, the terminal lens elements could be provided with individually controllable focus actuators.

Figure 7:
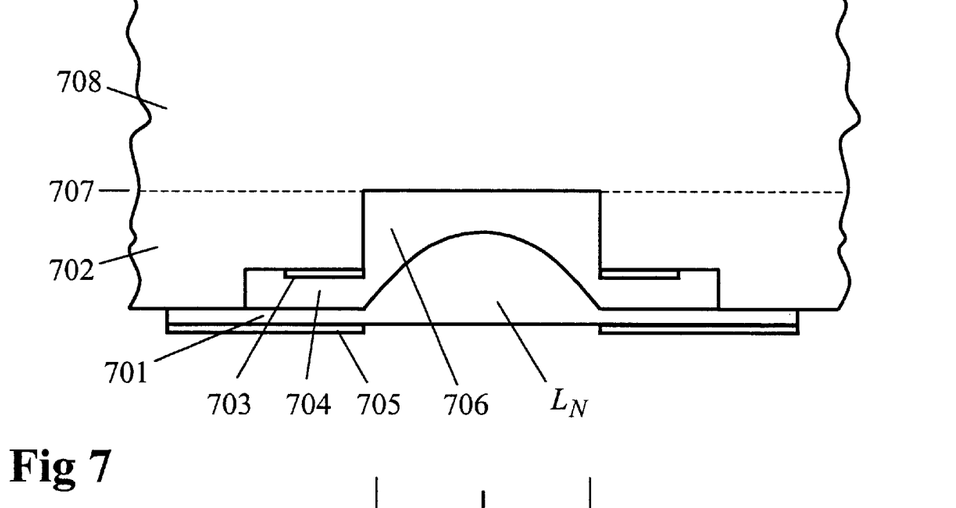
FIG. 7 is a cross-sectional view of a focus-actuated microlens.

FIG. 7 illustrates one embodiment of a focus-actuated microlens design. The terminal microlens element $L_N$ (e.g., $L_2$ in a two-stage system) is formed on a flexure layer 701, which is attached at its periphery to a substrate 702. (The flexure could have a structure similar to the ribbon elements in the "grating light valve", which is described in U.S. Pat. Nos. 5,841,579 and 5,661,592.) A first conductive layer 703 is formed in a shallow well 704 in the substrate, proximate to flexure 701, and a second conductive film 705 is formed on the flexure. A deeper well 706 is also formed in the substrate to accommodate the microlens itself. (In some embodiments the second well could extend all the way through the substrate, forming an open light transmission channel.)

Figure 8:
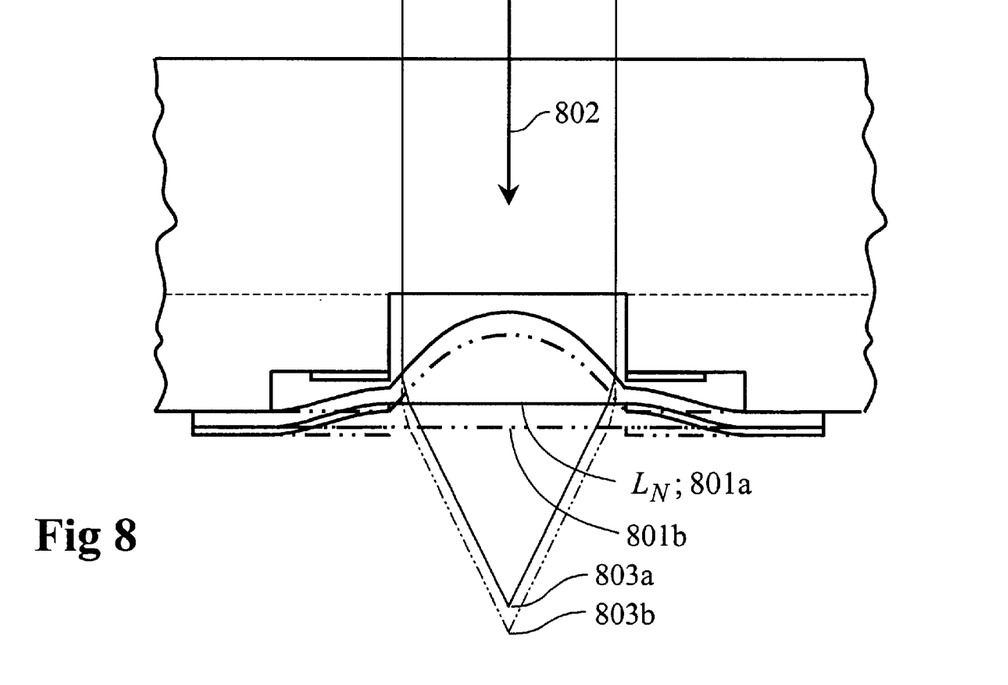
FIG. 8 illustrates a focus-actuated microlens in two different focus positions.

The microlens is actuated by means of electrostatic attraction between conductive films 703 and 705. For example FIG. 8 illustrates the microlens in two different focal positions, 801a and 801b. Incident radiation 802 (which has been focused by corresponding lens elements $L_1 \ldots L_{N-1}$) is brought to a focus (e.g., at point 803a or point 803b) by $L_N$, and the focus height is adjusted by moving the microlens.

An array of focus-actuated microlenses could be used to print high-resolution patterns on a printing surface in the manner disclosed above and in the cross-referenced patent applications. The focus adjustment would be used to compensate for factors such as surface topography or non-flatness, or warp distortion in the microlens array itself. In the context of microscopy applications the reflected signal from each microlens could be sampled over a range of focus positions to determine focus height. Surface height variations may be automatically tracked and measured by modulating each microlens's focal position at a high frequency while the mean focus height is controlled by a biasing signal. The corresponding frequency component would be detected in the confocal signal from each microlens, and this would be used to control the focus bias level and thereby keep each microlens centered at its best-focus position. The position of best focus corresponds to the maximum confocal signal (cf. FIG. 30 in the '096 application), and a microlens's confocal signal component at the modulation frequency would vanish when the microlens is in best focus.

The microlens actuator components can be constructed by using microfabrication processes similar to those described in U.S. Pat. No. 5,661,592. The microlens system could be built on a transparent substrate and the microlens surface contours could be formed using gray-scale lithography. (At infrared wavelengths silicon is transparent and may be used as a substrate material.) Alternatively, an opaque substrate might be used, in which case the well 706 in FIG. 7 would go all the way through the substrate, providing an open light channel. Another approach would be to form the microlens array on a thinned silicon substrate, which is then bonded to a thicker transparent substrate. In FIG. 7 the bond line is illustrated as 707, the thinned silicon layer is illustrated as 702, and the transparent substrate is indicated as 708. (Note that the well 706 goes through the silicon layer.)

A focus-actuated microlens structure such as that illustrated in FIG. 7 could be fabricated by the following basic steps: (1) Form the wells 704 and 706 and first conductive layers 703; (2) Fill the wells 704 and 706 with a sacrificial material, planarize the material and gray-scale etch it to form a cavity to define the microlens surface shape; (3) Deposit and planarize the microlens material to form the microlenses $L_N$ and flexure layers 701. (As part of step 3 the exposed microlens surface could optionally also be gray-scale etched to provide a second curved lens surface.); (4) Form the second conductive layers 705; and. (5) Remove the sacrificial material. Many of these fabrication steps would be similar to those described in U.S. Pat. No. 5,661,592, and gray-scale lithography is described in "Micro-optics: Elements, systems and applications," ed. Hans Peter Herzig, Taylor & Francis 1997 (page 140). This reference also describes alternative microlens forms that could be used (e.g., molded microlenses, gradient-refractive-index planar microlenses, melted-resin microlens, miniature Fresnel lenses, or Fresnel zone plate microlenses). Microlenses manufactured by such methods are commercially available from sources such as MEMS Optical in Huntsville, Ala.

Other variations on the above process are also possible. For example, microlens structures (or microlens molds in a sacrificial material) can be made using shadow-mask lithography, rather than gray-scale lithography. Processes of this type are described in "Microlens formation by thin-film deposition with mesh-shaped masks" (Applied Optics Vol. 38, No. 19, Jul. 1, 1999, pp. 4117–4124), and in "Direct growth of nanostructures by deposition through an $Si_3N_4$ shadow mask" (Physica E, Vol. 4, 1999, pp. 196–200). These are deposition processes, but shadow mask methods can also be used with etch processes (U.S. Pat. No. 5,882,468).

While the above is a complete description of specific embodiments of the invention, various modifications, alternative constructions, and equivalents may be used. Therefore, the above description should not be taken as limiting the scope of the invention as defined by the claims.

What is claimed is:

1. A printing system comprising:
    an optical projection system having an object plane, an image plane which is conjugate to the object plane, and a limiting aperture stop which is referred to as the projection aperture;
    a multi-stage microlens array comprising compound lenses having respective first-stage lens apertures defining a microlens aperture array, wherein the aperture array is positioned at the projection system's image plane, and wherein the compound lenses have respective terminal lens elements and corresponding terminal focal points which define a focal point array;
    a scanning mechanism which establishes relative motion between the microlens array and a printing surface proximate the focal point array, wherein the paths traversed by the focal points relative to the printing surface comprise a set of closely-spaced raster lines;
    an image source comprising an array of light-modulating image source elements, wherein the image source is positioned at the projection system's object plane, and wherein the projection system images each image source element onto a corresponding first-stage lens aperture and the image source element thus controls the light level over a microspot on the printing surface, proximate the corresponding terminal focal point; and
    an image modulation mechanism that controls the image source as the printing surface is scanned, whereby, when a photosensitive material is positioned in the printing surface, a synthesized, high-resolution raster image is recorded on the photosensitive material.

2. The printing system of claim 1, wherein the microlens array's terminal lens elements are focus-actuated.

3. An imaging system comprising:
    an optical projection system having an object plane, an image plane which is conjugate to the object plane, and a limiting aperture stop which is referred to as the projection aperture;
    a multi-stage microlens array comprising compound lenses having respective first-stage lens apertures defining a microlens aperture array, wherein the aperture array is positioned at the projection system's object plane, and wherein the compound lenses have respective terminal lens elements and corresponding terminal focal points which define a focal point array;
    a scanning mechanism which establishes relative motion between the microlens array and an imaging sample proximate the focal point array, wherein the paths traversed by the focal points relative to the sample comprise a set of closely-spaced raster lines;
    a detector comprising an array of light-sensing detector elements, wherein the detector is positioned at the projection system's image plane, and wherein the projection system images each first-stage lens aperture onto a corresponding detector element and the detector element thus responds to light originating from a microspot on or in the sample, proximate the corresponding terminal focal point; and
    a data acquisition system for recording the detector response as the scanning mechanism operates to establish relative motion between the sample and the microlens array, whereby a high-resolution raster image of the sample is synthesized.

4. The imaging system of claim 3, further comprising an illumination system, and wherein the microlens array and projection system are further configured to focus light from the illumination system onto the microspots to provide sample illumination.

5. The imaging system of claim 3, wherein the microlens array's terminal lens elements are focus-actuated.

* * * * *

UNITED STATES PATENT AND TRADEMARK OFFICE
CERTIFICATE OF CORRECTION

PATENT NO.    : 6,424,404 B1
DATED         : July 23, 2002
INVENTOR(S)   : Kenneth Carlisle Johnson It is certified that error appears in the above-identified patent and that said Letters Patent is hereby corrected as shown below:

<u>Column 5,</u>
Line 9, change "304" to -- 305 --.

Signed and Sealed this

Twenty-second Day of July, 2003

JAMES E. ROGAN
*Director of the United States Patent and Trademark Office*